United States Patent
Furuta et al.

(10) Patent No.: US 7,514,996 B2
(45) Date of Patent: Apr. 7, 2009

(54) DISTORTION COMPENSATION AMPLIFYING APPARATUS

(75) Inventors: Satoshi Furuta, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 5 days.

(21) Appl. No.: 11/662,331

(22) PCT Filed: Sep. 12, 2005

(86) PCT No.: PCT/JP2005/016746

§ 371 (c)(1),
(2), (4) Date: Mar. 8, 2007

(87) PCT Pub. No.: WO2006/033256

PCT Pub. Date: Mar. 30, 2006

(65) Prior Publication Data

US 2008/0197925 A1   Aug. 21, 2008

(30) Foreign Application Priority Data

Sep. 21, 2004 (JP) .............................. 2004-272986

(51) Int. Cl.
*H03F 1/26* (2006.01)
(52) U.S. Cl. ...................... 330/149; 330/136
(58) Field of Classification Search ................. 330/136, 330/149
See application file for complete search history.

(56) References Cited

U.S. PATENT DOCUMENTS 5,903,611 A   5/1999   Schnabl et al.

7,259,630 B2 *   8/2007   Bachman et al. ............ 330/297
2002/0016154 A1   2/2002   Huttunen

FOREIGN PATENT DOCUMENTS

| JP | A 10-32435 | 2/1998 |
|---|---|---|
| JP | A 2001-284976 | 10/2001 |
| JP | A 2002-223171 | 8/2002 |
| JP | A 2002-533022 | 10/2002 |
| JP | A 2003-78360 | 3/2003 |
| JP | A 2003-87065 | 3/2003 |
| JP | A 2003-229727 | 8/2003 |
| JP | A 2004-128833 | 4/2004 |
| JP | A 2005-24847 | 1/2005 |
| JP | A 2005-198349 | 7/2005 |
| WO | WO 00/36800 A2 | 6/2000 |

* cited by examiner

*Primary Examiner*—Steven J Mottola
(74) *Attorney, Agent, or Firm*—Oliff & Berridge PLC

(57) ABSTRACT

An amplifier apparatus for providing a pre-distortion to perform a distortion compensation, wherein even if the frequency of occurrence of levels around the input signal peak is small, a distortion compensation table is efficiently updated so as to improve the performance of the distortion compensation. The compensation values of a distortion compensation table (2) are divided into a first group of compensation values corresponding to large input levels that lead to large output distortions and a second group of compensation values corresponding to the other small input levels. If a level detected by a level detecting part (1) exceeds a threshold value, a control part (5) updates the first group of compensation values. Otherwise, the control part (5) updates the second group of compensation values. In this way, the updating process can be effectively performed even for signals having small frequencies of occurrence of the peak values of the signal levels as in the CDMA or OFDM system, thereby improving the performance of the distortion compensation.

10 Claims, 11 Drawing Sheets

FIG.1 BASIC CONFIGURATION OF DISTORTION COMPENSATION AMPLIFYING APPARATUS ACCORDING TO THE INVENTION

DISTORTION COMPENSATION AMPLIFYING APPARATUS

TECHNICAL FIELD

The present invention relates to a distortion compensation amplifying apparatus and, more particularly, to a distortion compensation amplifying apparatus including a pre-distorter having characteristics inverse to distortion characteristics of the amplifier which imparts distortion to an input signal and inputs its output to the amplifier.

BACKGROUND ART

For example, in a mobile communication system employing the W-CDMA (Wide-band Code Division Multiple Access) system, a radio signal from an apparatus at a base station must reach an apparatus at a mobile station which is physically distant. For this reason, the signal must be greatly amplified by an amplifying apparatus at the base station, and amplification is performed using even a range in which non-linear characteristics attributable to saturation can appear. Measures are therefore taken to suppress a distortion signal generated by non-linear characteristics and the like.

Recently, the pre-distortion method that allows efficient amplification is frequently used as a method for suppressing such a distortion signal. FIG. 3 is a block diagram schematically showing a distortion compensation amplifying apparatus according to the related art employing the pre-distortion method. An amplitude compensation value a and a phase compensation value b associated with each level of an input signal $S_{IN}$ are stored in a distortion compensation table 32 in the form of, for example, a complex amplitude (vector). A level (power or amplitude) of an input signal $S_{IN}$ is detected by a level detection unit 31, and an address signal A associated with the detected value is sent to the distortion compensation table 32. The address signal A specifies the addresses of an amplitude compensation value a and a phase compensation value b to be read from the distortion compensation table 32.

A pre-distorter 33 imparts a change to each of the amplitude and phase of the input signal $S_{IN}$ according to a pre-distortion control signal output from the distortion compensation table 32. Therefore, the amplitude compensation values a and phase compensation values b in the distortion compensation table 32 may be set such that the changes are imparted to the input signal $S_{IN}$ as changes having characteristics inverse to distortion of the amplitude and phase of the signal or distortion characteristics generated at each level of the input to the amplifier 34. Thus, distortion components are eliminated from an output signal $S_{OUT}$ output by the amplifier 34, which makes it possible to suppress leakage of power from the signal band or interference power to any adjacent channel. Hereinafter, changes imparted to the input signal $S_{IN}$ by the compensation values will be referred to as pre-distortions.

While the amplifier 34 in FIG. 3 is an amplifier for a radio frequency signal band, the distortion compensation table 32, a control unit 35, and so on may be digital circuits, and the signal $S_{IN}$ input to the pre-distorter 33 and the level detection unit 31 may be a signal in either radio frequency band or intermediate frequency band. Therefore, a frequency converter and an A-D or D-A converter are added to the circuit shown in FIG. 3 in practice depending on the configuration of those circuits. Since such variation in the circuit configuration does not relate to the invention, FIG. 3 shows a fundamental configuration only.

The characteristics of the amplifier 34 undergo changes attributable to aging and temperature changes. Unless the amplitude compensation value a and the phase compensation value b in the distortion compensation table 32 are varied in associated with such changes, distortion compensation on a pre-distortion basis cannot be properly performed. The control unit 35 acquires at least an output signal from the amplifier 34 or an evaluation value of residual distortion included in the output signal as a feedback signal and updates the compensation values in the distortion compensation table according to changes in the characteristics of the amplifier 34 to maintain optimum compensation values.

Although it is desirable that the adaptive updating of the distortion compensation table 32 performed by the control unit 35 quickly converges at optimum values, quick convergence is difficult to achieve for the reasons described below.

FIG. 4 is a graph showing an example of input-output characteristics of the amplifier 34. As shown in FIG. 4, non-linearity of the input-output characteristics of the amplifier appears more significantly as the input level becomes higher and closer to the region where the output saturates. It is therefore necessary to acquire feedback signals of output signals having great amplitudes into the control unit 35 and reflect the signals in the distortion compensation table. However, the probability of generation of, for example, W-CDMA signals having great amplitude is low, and they will be only instantaneously generated.

For example, let us assume that there are four W-CDMA carriers. Then, the signal band is 20 MHz, and an average digital device cannot perform real-time processing if sampling signals of about 100 MHz are used to deal with third- and fifth-order distortions further. When feedback signals are acquired only intermittently by stopping the acquisition of feedback signals while the control unit 35 is detecting distortion components from a feedback signal that the unit has acquired, the probability of acquiring feedback signals of output signals having great amplitude is further decreased.

Under the circumstance, various studies are being made to achieve quick convergence of compensation values.

For example, the "non-linear distortion-compensation transmitter for correcting and interpolating distortion compensation coefficients" disclosed in Patent Document 1 is equipped with distortion compensation coefficient correction means. Thus, when a distortion compensation coefficient associated with a certain input signal level is significantly different from a distortion compensation coefficient associated with another level in the neighborhood of that level, a correction process is performed to replace the deviating distortion compensation coefficient with an average of values in the neighborhood or the like. What is intended is to reduce the time require for a process of updating distortion compensation coefficients with reference to the power of distortions of transmitted outputs. The document also proposes a configuration intended for a reduction of the memory amount of a distortion compensation table, in which only distortion compensation coefficients associated with discrete input signal levels are stored and updated and in which distortion compensation coefficients associated with levels unlisted on the table are generated from the values on the table using interpolation. Referring to table updating according to Patent Document 1, an error between an input signal and an output signal is obtained, and a coefficient which nullifies the error is calculated using clipped LMS (Least Mean Square) algorithm.

In a "distortion compensation apparatus" disclosed in Patent Document 2, input signal levels are divided into a plurality of blocks, and each block is sequentially picked up to update compensation values associated with the input levels included in the block using the perturbation method such that distortions are eliminated from the transmission outputs. When the block including the greatest input signal level is updated, the update process is performed using only distortions of transmission outputs associated with input signal levels exceeding a predetermined value. This is a consideration for transmission signals which are at a peak value or a value near the peak only for a small percentage of time, i.e., transmission signals using a multi-code according to the CDMA method or multi-carrier transmission signals according to the OFDM (Orthogonal Frequency Division Multiplexing) method. Specifically, since small input signal levels result in small distortion outputs, the updating of a compensation value associated with a great input level will take a long time to reach a proper compensation value if the updating process is performed using distortions associated with arbitrary input levels, and the accuracy of resultant compensation values on the table will be low. Therefore, when the block including the greatest input level is updated as described above, the updating process is performed only when there are inputs exceeding a predetermined value and is omitted for small input levels, which allows convergence at high speed and high efficiency.

In the case of a "power amplifier" disclosed in Patent Document 3, feed forward type distortion compensation is performed with control over amplitude and phase matching in a distortion detecting loop or distortion eliminating loop stopped when a residual distortion is equal to or less than a threshold. As a result, quick convergence can be achieved, and stable distortion compensation can be maintained after the convergence is achieved.

Patent Document 1: JP-A-2002-223171
Patent Document 2: JP-A-2003-78360
Patent Document 3: JP-A-2003-87065

DISCLOSURE OF THE INVENTION

Problems to be Solved by the Invention

In a cellar phone system, each base station may be put in a non-transmitting state at random timing in order to cope with the problem of distance encountered in detecting the positions of terminals. Such non-transmitting periods are referred to as IPDL (Idle Periods create in the Down Link) and defined in Section 9.1 of TS25.305 "UTRAN Stage 2 Specification" of 3GPP standard.

During such a period, the amplifier 34 has no input at all and outputs only low noises which include no distortion associated with an input level.

However, in a conventional distortion compensation amplifying apparatus, a distortion compensation table is updated based on the result of detection of distortions from feedback signals regardless of whether the apparatus is in such a non-transmitting period or not, which has resulted in at least wasteful data acquisition and data processing operations. A problem has therefore arisen in that a limitation is placed on time to be allotted for other processes.

When the control unit 35 is a type which detects out-of-band leakage power as a distortion using FFT (Fast Fourier Transform) or the like, an increase or decrease of distortions cannot be properly detected and convergence is consequently delayed if feedback signals of transmission signals at low levels generating no non-linear distortion are frequently acquired. That is, since adaptive algorithm commonly used for updating a distortion compensation table has a kind of habit, it takes long time for convergence to take place in a correct direction after the distortion compensation table is once updated in a wrong direction. For example, according to a type of the perturbation method, when it is detected as if there was a decrease in distortions because of a non-transmitting period in spite of the fact that updating has been made in the direction of moving away from optimum values, the next updating will also take place in the wrong direction. Thereafter, the updating direction is corrected, and the initial compensation amount is restored by the next update. Therefore, three or four updates must be made where one update should have been sufficient if distortions had been properly detected.

When the ratio occupied by non-transmitting periods is small where such a problem exists, the influence of the non-transmitting periods can be made negligible by acquiring signals for a time sufficiently longer than the non-transmitting periods. However, a memory having a great capacity is required for temporarily storing feedback signals for this purpose, and another problem arises in that the increase in data acquisition time results in a reduction of the speed of convergence.

According to the technique disclosed in the above-cited Patent Document 2, the compensation values for the block including the greatest input level are updated through repetition of an operation of imparting pre-distortions to the input signals by introducing very small amounts of deviation to the compensation values for the block and checking the amounts of distortions in output signals when there are input signals exceeding a predetermined threshold in that state after waiting for the inputs to exceed the predetermined threshold. For example, when the smallest input level in the block is used as the above-described threshold, since the input signal levels exceed the threshold only at a small percentage of time, the updating of the block keeps on waiting without any action (until an input signal level exceeds the threshold) during a majority of its duration that is occupied by input levels equal to or lower than the threshold. Thus, a further improvement in efficiency is demanded.

It is an object of the invention to provide a distortion-compensation amplifying apparatus which is configured to allow an improvement in the efficiency of updating of compensation values to be used for a distortion compensation method employing pre-distortion such as the CDMA method or OFDM method where near-peak values of transmission signals are generated at a low frequency and which further allows convergence to be achieved in a short time without any increase in the scale of hardware even in amplifying a signal having non-transmitting periods.

Means for Solving the Problems

In order to achieve the above-described object, a first distortion compensation amplifying apparatus according to the invention includes a pre-distorter for imparting pre-distortion to an input signal, an amplification unit for amplifying the pre-distorted input signal, a threshold detecting unit for detecting that a level of the input signal has exceeded a threshold, and a control unit for updating the mode of distortion compensation of the pre-distorter based on a feedback signal from the amplification unit at the time of detection by the threshold detecting unit.

Preferably, the apparatus further includes a memory for storing the feedback signal based on the timing at which the threshold detecting unit detects that the input signal level has exceeded the threshold, and the control unit updates the distortion compensation mode using the feedback signal stored in the memory.

Preferably, the threshold detecting unit receives the input of the feedback signal and detects that a level of the input signal has exceeded the threshold based on the feedback signal.

Preferably, the control unit does not update the mode of the distortion compensation unless the threshold detecting unit detects that the input signal level has exceeded the threshold.

Preferably, the threshold is set greater than a level in the absence of the input signal and smaller than a normal level at the time of the input signal.

Preferably, the control unit models the pre-distortion using an exponential function of the amplitude of the input signal, evaluates a time-averaged value of out-of-band leakage power included in the feedback signal as a distortion amount, and updates a coefficient of the exponential function such that the distortion amount decreases.

Preferably, the threshold is set at a peak level which is higher than a normal standard level.

Preferably, the control unit sets different thresholds in the threshold detecting unit according to the state of updating of the distortion compensation mode.

Preferably, the control unit represents a mode of distortion compensation using a plurality of parameters and sets a threshold associated with each parameter in the threshold detecting unit when the parameter is updated.

A second distortion compensation amplifying apparatus according to the invention includes level detecting means for detecting levels of an input signal, a distortion compensation table for outputting pre-distortion control signals associated with the input levels detected by the level detecting means, a pre-distorter for imparting distortion according to the pre-distortion control signals output from the distortion compensation table to the input signal, an amplifier for amplifying the input signal distorted by the pre-distorter, distortion detecting means for detecting a time-average of distortion output from the amplifier as a distortion amount, and table updating means for updating the pre-distortion control signal such that the distortion amount becomes smaller. The table updating means divides the pre-distortion control signals into a first group associated with input levels of the input signal greater than a predetermined threshold and a second group constituted by at least part of the remaining pre-distortion control signals. The table updating means fetches the input levels, updates a pre-distortion control signal in the first group when an input level thus fetched is greater than the threshold, and updates a pre-distortion control command in the second group when the fetched input signal level is smaller than the second threshold.

Preferably, the threshold is set such that an expected value of the number of occurrences of the levels belonging to the first group is 0.5 or more in a period in which distortions are time-averaged when it is determined that the input levels are greater than the threshold.

ADVANTAGE OF THE INVENTION

According to the invention, since unnecessary distortion amounts are not acquired when distortion compensation amount is updated, it is possible to provide a distortion compensation amplifier whose mode of distortion compensation converges at a high speed.

According to the invention set forth in Claim X, even in a case wherein a peak value or level near the same appear at a low frequency as encountered in a CDMA system or OFDM system, amplitude compensation values and phase compensation values in the first group which have significant influence on distortion characteristics are always updated when there is an input exceeding the second threshold, and the amplitude compensation values and phase compensation values in the second group are always updated when there is an input level equal to or lower than the second threshold. Therefore, the frequency of the updating of the amplitude compensation values and phase compensation values in the first group is improved from that in the related art. Further, when there is a low input level, the second group is always updated without waiting for the input of a high input level. Thus, the speed of convergence of distortion compensation can be higher than that in the related art.

BEST MODE FOR CARRYING OUT THE INVENTION

A mode for carrying out the invention will now be described with reference to the drawings.

Means for realizing a function explained in each embodiment may be any circuit or device as long as the means realizes that function, and part or whole of the function may be provided by software. Further, means for realizing a function may be provided by a plurality of circuits, and a plurality of function realizing means may be provided by a common circuit.

Arbitrary combinations of features of embodiments of the invention and combinations of the features with the related art referred to above may be included in the scope of the invention.

EMBODIMENT 1

Figure 5:
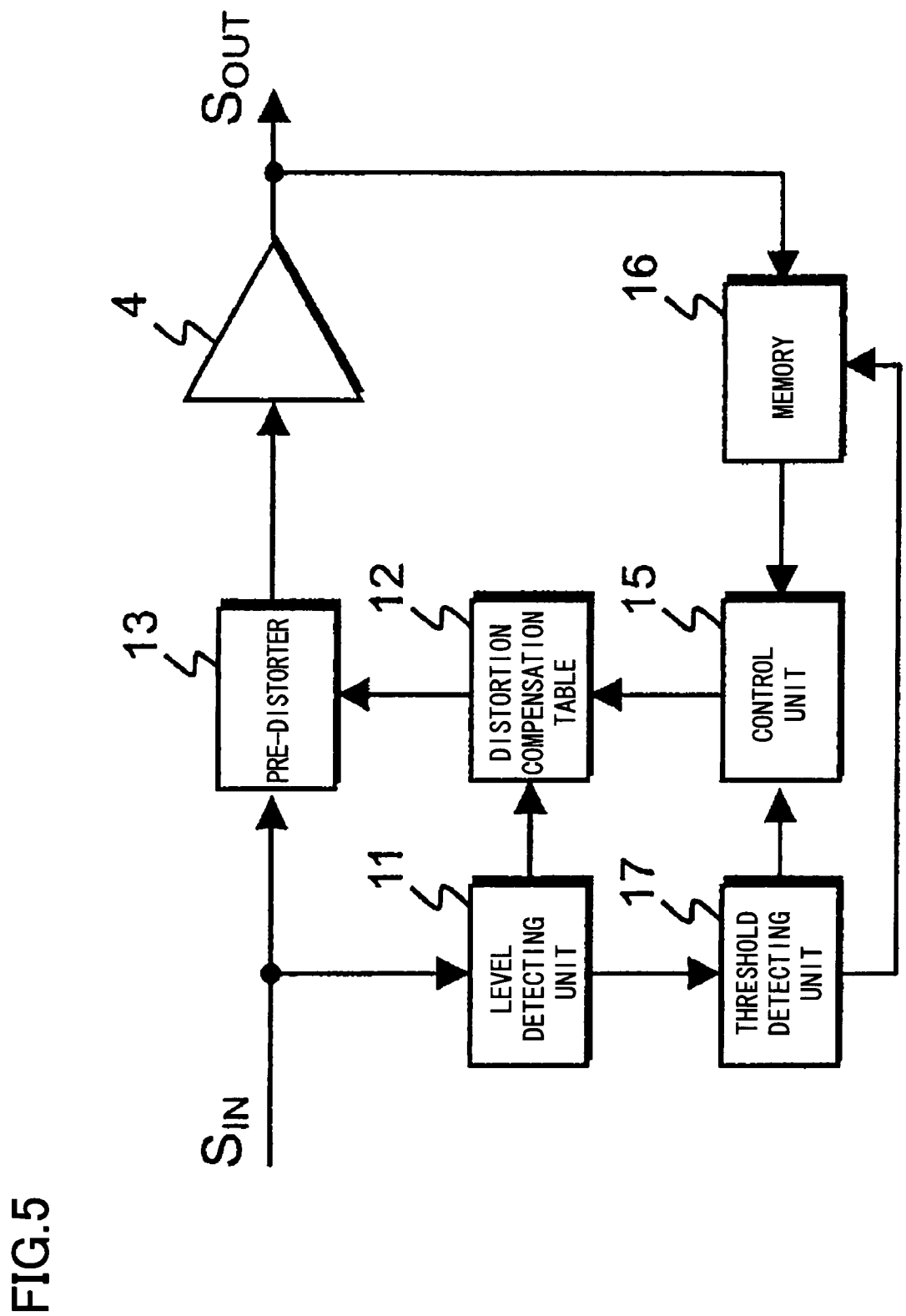
FIG. 5 is a diagram showing a basic configuration of a distortion compensation amplifying apparatus of Embodiment 1.

FIG. 5 is a block diagram showing a basic configuration of a distortion compensation amplifying apparatus of Embodiment 1. The distortion compensation amplifying apparatus of this embodiment is characterized in that it explicitly includes a threshold detecting unit 17 for providing timing for acquisition of a feedback signal by detecting that a signal level has exceeded a threshold, and a memory 16 for storing the feedback signal, and so on.

Figure 3:
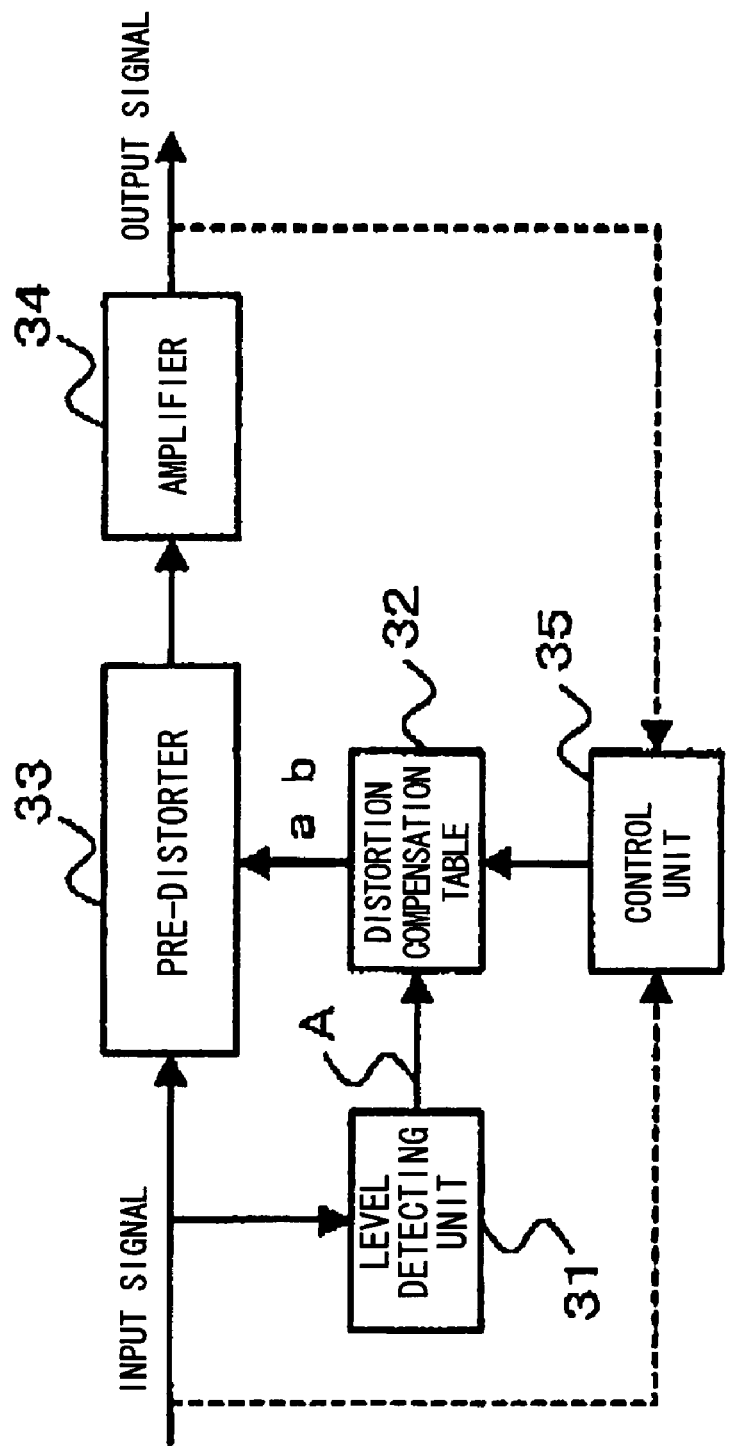
FIG. 3 is a block diagram showing a basic configuration of a distortion compensation amplifying apparatus according to the related art.
Figure 4:
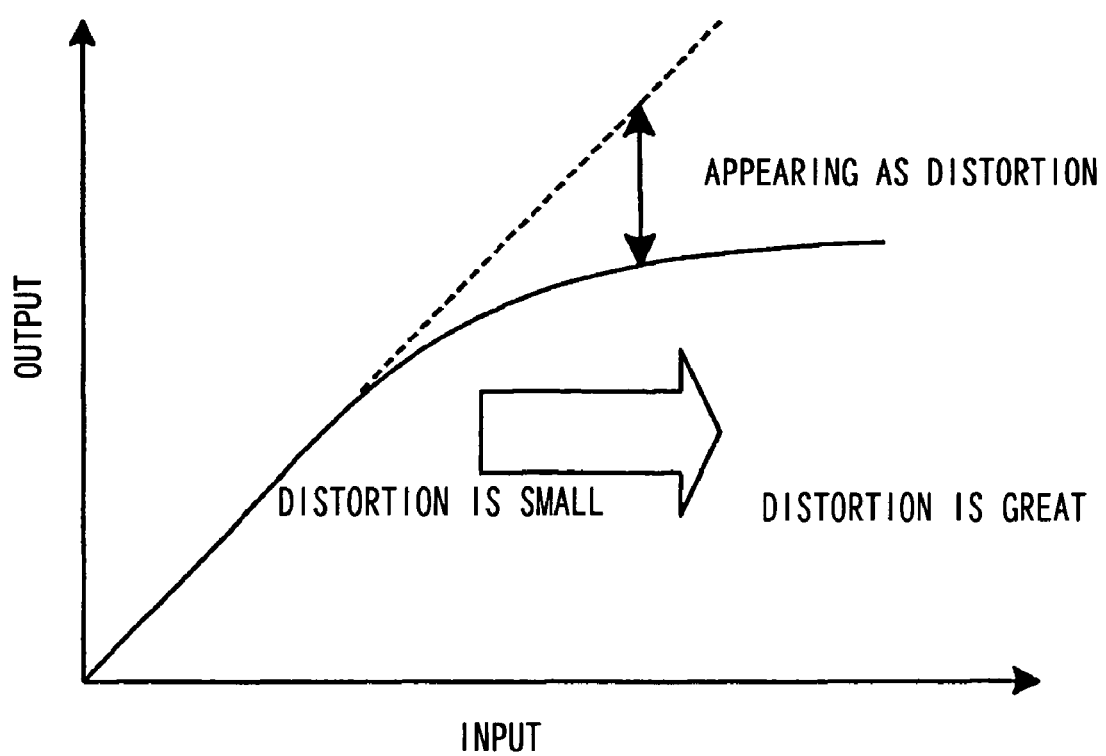
FIG. 4 is a graph showing an example of input-output characteristics of the amplifier.

As described with reference to FIG. 3, a frequency converter and an A-D or D-A converter are provided and configured depending on whether a pre-distorter 13 and a level detecting unit 11 are configured in adaptation to signals in a radio frequency band or signals in an intermediate frequency band. However, the present embodiment is not essentially dependent on such situations, and it can be used in either situation. Therefore, the description will address fundamental constituent elements only.

Each part shown in FIG. 5 will now be described. An element indicated by a reference numeral that likely appears in the description of the related art is basically similar to the related art in configuration. Hereinafter, the term "input signal" means an input signal to the distortion compensation amplifying apparatus shown in FIG. 5 unless otherwise specified.

An input signal is input to the level detecting unit 11, and the unit detects a level representing the instantaneous power of the input signal or a value in one-to-one correspondence to the instantaneous power of the input signal such as amplitude that is the square root of the power or a logarithmic value of the same and outputs the level to a distortion compensation table 12 and the threshold detecting unit 17. For example, the operating frequency is twice or more of the frequency corresponding to the band width of the input signal.

Distortion compensation values for executing distortion compensation on a pre-distortion basis are stored in the distortion compensation table 12 in association with levels provided by the level detecting unit 11. Each time a level is input from the level detecting unit 11, compensation values associated with the same are output to a pre-distorter 13.

The pre-distorter 13 receives the input of the compensation values obtained by referring to the distortion compensation table 12 and the input signal, controls the amplitude and phase of the input signal according to the compensation, and outputs the resultant signal to an amplifier 4.

The amplifier 4 amplifies the input signal which has been thus distorted in advance on a pre-distortion basis and outputs the resultant signal.

Feedback signals obtained by performing an appropriate process such as demodulation or detection of out-of-band leakage power on the output of the amplifier 4 are written and stored in the memory 16 on a time-sequential basis and are read and output at any time in response to reference made by a control unit 15. For example, the write operation is performed on a ring buffer basis, and it is temporarily stopped and resumed according to instructions from the threshold detecting unit 17.

The control unit 15 first gives a start instruction to the threshold detecting unit 17. When an end report indicating a range of addresses where feedback signals are stored is received from the threshold detecting unit 17, the unit reads the feedback signals associated with the address range from the memory 16 to evaluate residual distortion and updates the distortion compensation table 12 using adaptive algorithm utilizing the evaluation values.

When the start instruction is received from the control unit 15, the threshold detecting unit 17 resumes the writing of feedback signals in memory 16, compares levels with a threshold continually, and acquires the write address given to the memory 16 when the threshold is exceeded as an address at the time of detection. The unit stops the writing of feedback signals in the memory 16 when a predetermined time passes after the threshold is exceeded and acquires the write address given to the memory 16 at that time as an end address. The unit stops operating after send an end report to the control unit 15 along with the address at the time of detection. The threshold in the present embodiment is set at a value which is, for example, several dB higher than a level detected on an IPDL basis, and the threshold is considerably lower than an average level in the case of normal transmission. The threshold may be any value as long as it is certainly higher than the level in the case of IPDL and (almost) certainly lower than the level in the case of normal transmission.

Figure 6:
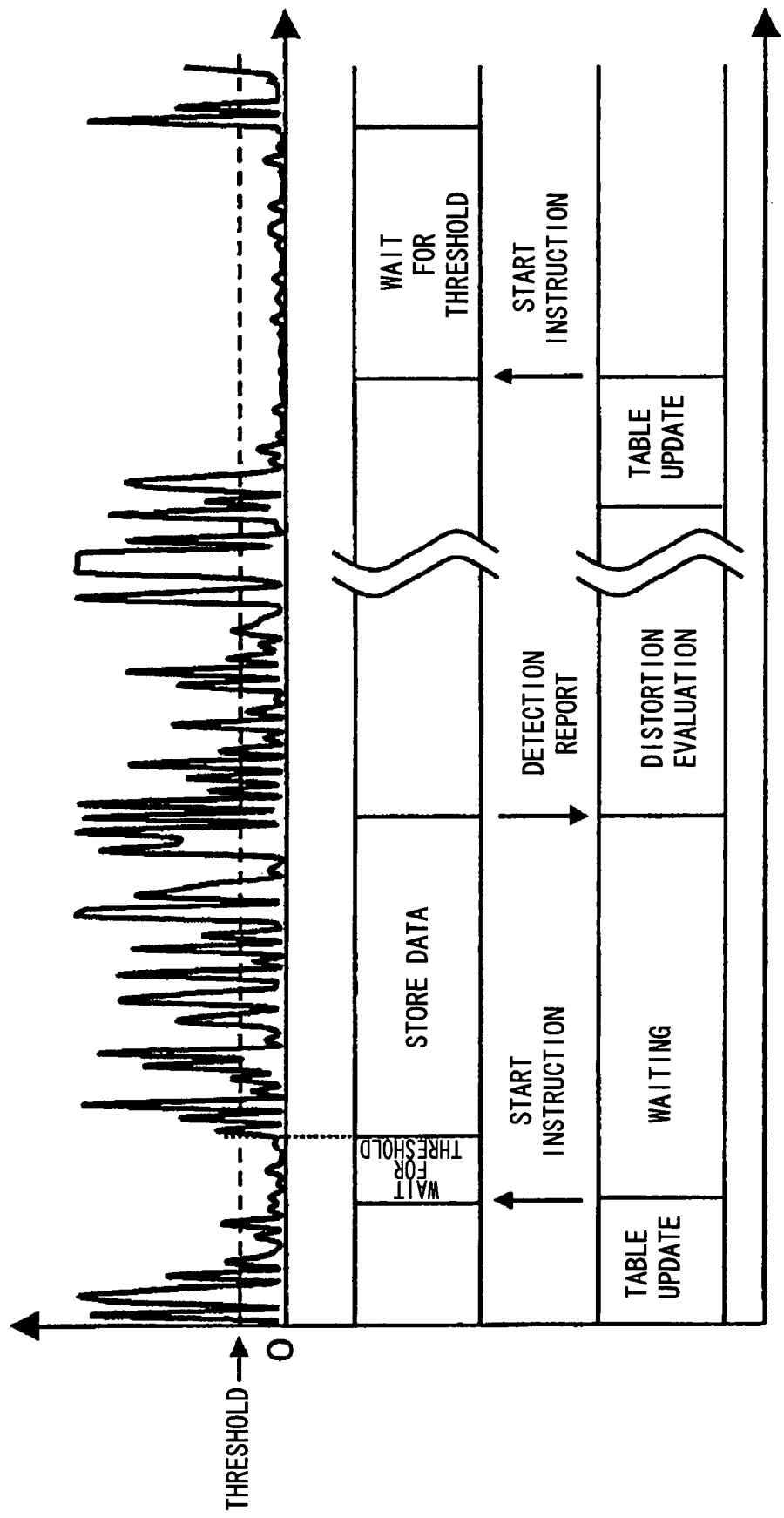
FIG. 6 is a time chart for explaining operations of Embodiment 1.

FIG. 6 is a time chart for explaining operations of the present embodiment. In FIG. 6, a time waveform of levels detected by the level detecting unit 11 is shown at the top; processes executed primarily by hardware are shown in the middle; and processes executed primarily by software are shown at the bottom. In the present embodiment, the level detecting unit 11, the distortion compensation table 12, the pre-distorter 13, the memory 16, and the threshold detecting unit 17 are constituted by hardware such as FPGAs (Field Programmable Gate Arrays) and memories, and the control unit 15 is constituted by a DSP (Digital Signal Processor) operating on software. Operations of the present embodiment are generally categorized into operations in a table update period, a feedback signal acquisition period following a start instruction, and a distortion evaluation period following an end report.

During the feedback signal acquisition period, feedback data is cyclically written in the memory 16 until transmission data at a level equal to or higher than the threshold appears at the level detecting unit 11. When transmission data equal to or higher than the threshold is detected, a preset amount of data is further written from the address where the current write has taken place, and then the writing is terminated. At this time, the address at the time of detection where a level equal to or higher than the threshold has been detected and the end address where writing is terminated are reported to the control unit 15 as a write ending report to stop the signal level detecting function. The activation of the level detecting unit 11 and number of addresses written after the detection are controlled by the control unit 15.

During the distortion evaluation period, upon receipt of the report, the control unit 15 detects distortion using the data residing between the address at the time of detection and the end address. In practice, an offset address is added to the address at the time of detection and the end address in order to correct them for a delay that the input signal whose level has been detected is subjected to before it is stored from the pre-distorter 13 into the memory 16 through an amplifier unit 4 as a feedback signal. Distortion compensation normally involves an averaging process for suppressing irregularities of detection values, and the number of pieces of data (the number of samples) used for detecting distortion is a predetermined plural number. That is, average distortion occurring in a predetermined time is detected. When irregularities can be absorbed by the update algorithm of the table, the number of data may be one.

During the table updating period, the control unit 15 updates the distortion compensation table 12 based on distortion components detected during the distortion evaluation period and activates the level detecting unit 11 again to start a feedback signal acquisition period. The same process is repeated thereafter.

The address offset added to correct a delay can be calculated by transmitting an impulse signal and checking the address in the memory 16 at which the feedback signal is at a maximum level. Alternatively, such an offset can be calculated by delaying each sample of the feedback signal, correlating the samples with the input signal, and identifying the amount of a delay which has resulted in the strongest correlation. Such a delay correction amount may be identified and set in advance, and it may alternatively be calculated and set during the operation of the amplifier.

In the present embodiment, neither acquisition of a feedback signal nor update of the distortion compensation table by the control unit takes place unless the threshold is exceeded. In particular, data acquisition is disabled when there is no transmission by setting the threshold at a level higher than noise levels. As a result, when there is no transmission, it is possible to stop the adaptive control of the pre-distorter exercised by the control unit after data acquisition, including the detection of distortion and the distortion compensation table updating process. Therefore, feedback signal data can be acquired without fail in a transmission state even from a signal which can instantaneously enter a non-transmission state, e.g., an IPDL signal. Since wasteful data acquisition is eliminated, the time required for acquiring useful data can be consequently reduced to achieve fast convergence.

EMBODIMENT 2

Figure 7:
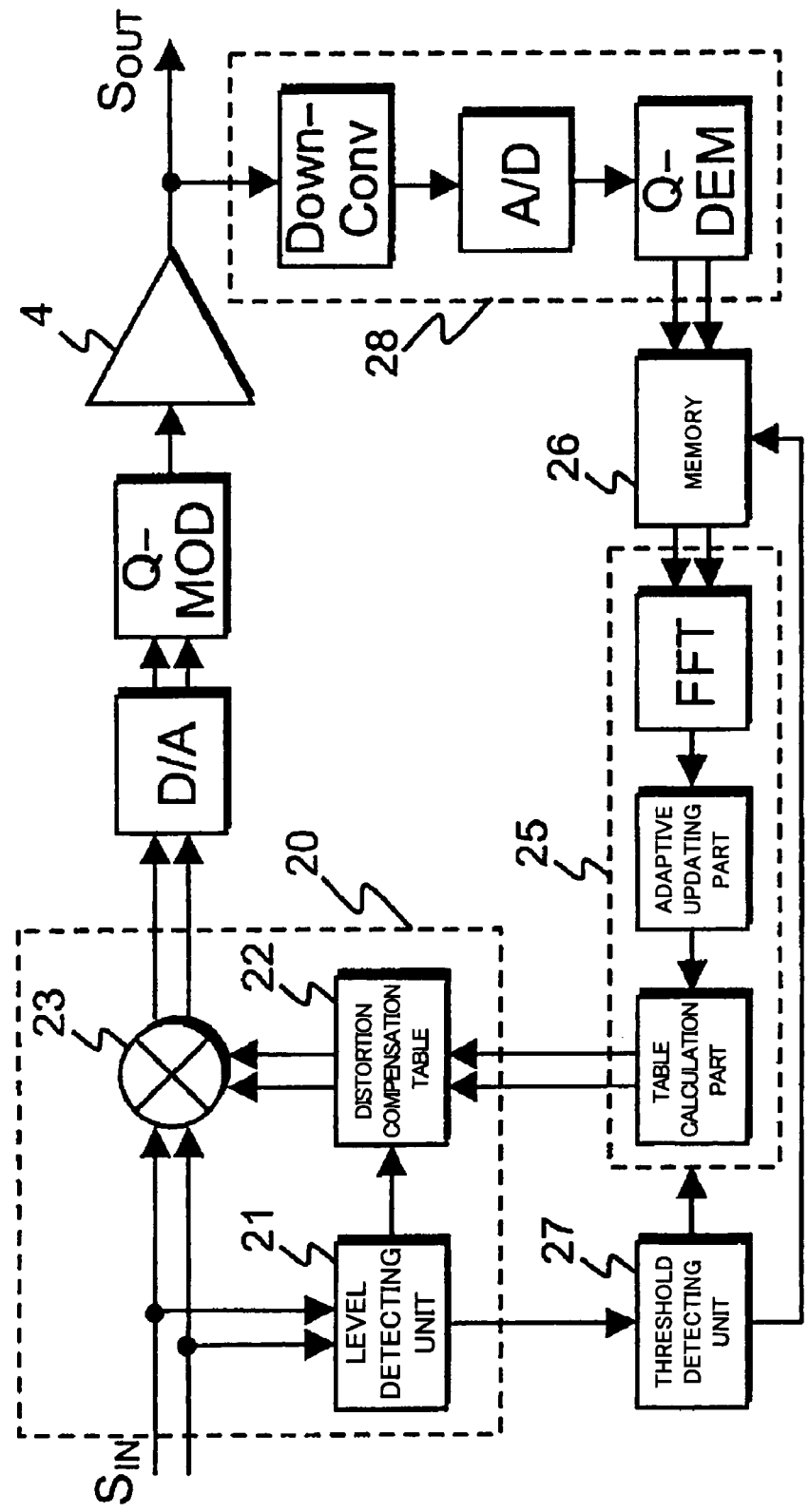
FIG. 7 is a diagram showing a configuration of a distortion compensation amplifying apparatus of Embodiment 2.

FIG. 7 is a block diagram showing a configuration of a distortion compensation amplifying apparatus of the present embodiment. The present embodiment is different from Embodiment 1 in that a level corresponding to what is called a peak higher than an average level of normal transmission is set as a threshold in a threshold detecting unit 27. The embodiment represents a more specific form of the invention in that a control unit 25 evaluates distortion using FFT and in that distortion at an amplifier 4 is modeled using exponential functions. The configuration of the present embodiment is equivalent to that of Embodiment 1 unless otherwise specified.

An input signal $S_{IN}$ is a digital IF signal which has a sampling frequency capable of covering a band wider than (e.g., three to five times) the signal band to be amplified, and the signal is represented by two lines because it has components at an I-phase and a Q-phase. A distortion compensation table 22 is provided to store compensation amounts for distortions attributable to AM-AM conversion and AM-PM conversion constituting non-linear characteristics of the amplifier 4 in a complex form. A pre-distorter 23 is constituted by a complex multiplier, and it performs complex multiplication of the input signal $S_{IN}$ and the compensation amounts and output the results. A D-A converter and an analog orthogonal modulator are provided between the pre-distorter 23 and the amplifier 4. An analog I/Q signal is converted into an RF signal by the analog orthogonal modulator.

A feedback circuit unit 28 down-converts part of an output signal $S_{OUT}$ from the amplifier 4 into an IF signal after placing a band restriction on the signal and performs A-D conversion of the resultant signal at a sampling frequency equivalent to or higher than that of the D-A converter at the transmitter. Digital orthogonal detection is thus performed to obtain an I/Q signal by demodulating the signal $S_{OUT}$ and to output it as a feedback signal.

The control unit 25 includes at least an FFT part, an adaptive updating part, and a table calculation part. The FFT part performs spectrum analysis on the feedback signal to detect spectral power outside the signal band to be amplified as a distortion. The specific configuration of the part may be the same as described in JP-A-2005-24847, and FFT of, for example, 1024 to 4096 points may be employed.

The adaptive updating part updates a coefficient of each term of two exponential functions for describing compensation values using the perturbation method based on a detected increase or decrease in distortion. The perturbation method may be implemented similarly to that described in Patent Document 2 and, for example, the coefficient of each term is cyclically updated. The two exponential functions are real variable functions relating to instantaneous amplitude (the square root of instantaneous electric power) and representing AM-AM conversion and AM-PM conversion, respectively. Since the two functional values represent an amplitude compensation value and a phase compensation value, respectively, those values are stored in the distortion compensation table 22 after being converted into a complex form (I/Q signals) in practice, and odd-order intermodulation distortion is primarily generated when they are multiplied with the input signal $S_{IN}$ by the pre-distorter 23.

The table calculation part calculates the exponential functions using the coefficients updated by the adaptive updating part to obtain all table values and writes the values in the distortion compensation table 22. It is not essential to write distortion compensation values in the distortion compensation table when exponential functions are used, and an alternative configuration may be employed in which distortion compensation values for each sample are calculated from exponential function values. In this case, a single pre-distorter unit 20 as indicated by the broken line may be configured instead of providing the level detecting unit 21, the distortion compensation table 22, and the pre-distorter 23 as separate elements.

A threshold detecting unit 27 provides an end report with an offset added such that the period from the point in time when the threshold is exceeded until the time when writing is stopped halved from that in Embodiment 1 and such that the address at the time of detection is retroactively moved by the half amount of time. Thus, the position where the threshold is detected as being exceeded occupies the center of data to be subjected to FFT, which prevents the data of a peak from being eliminated by a window function used in FFT.

Figure 8:
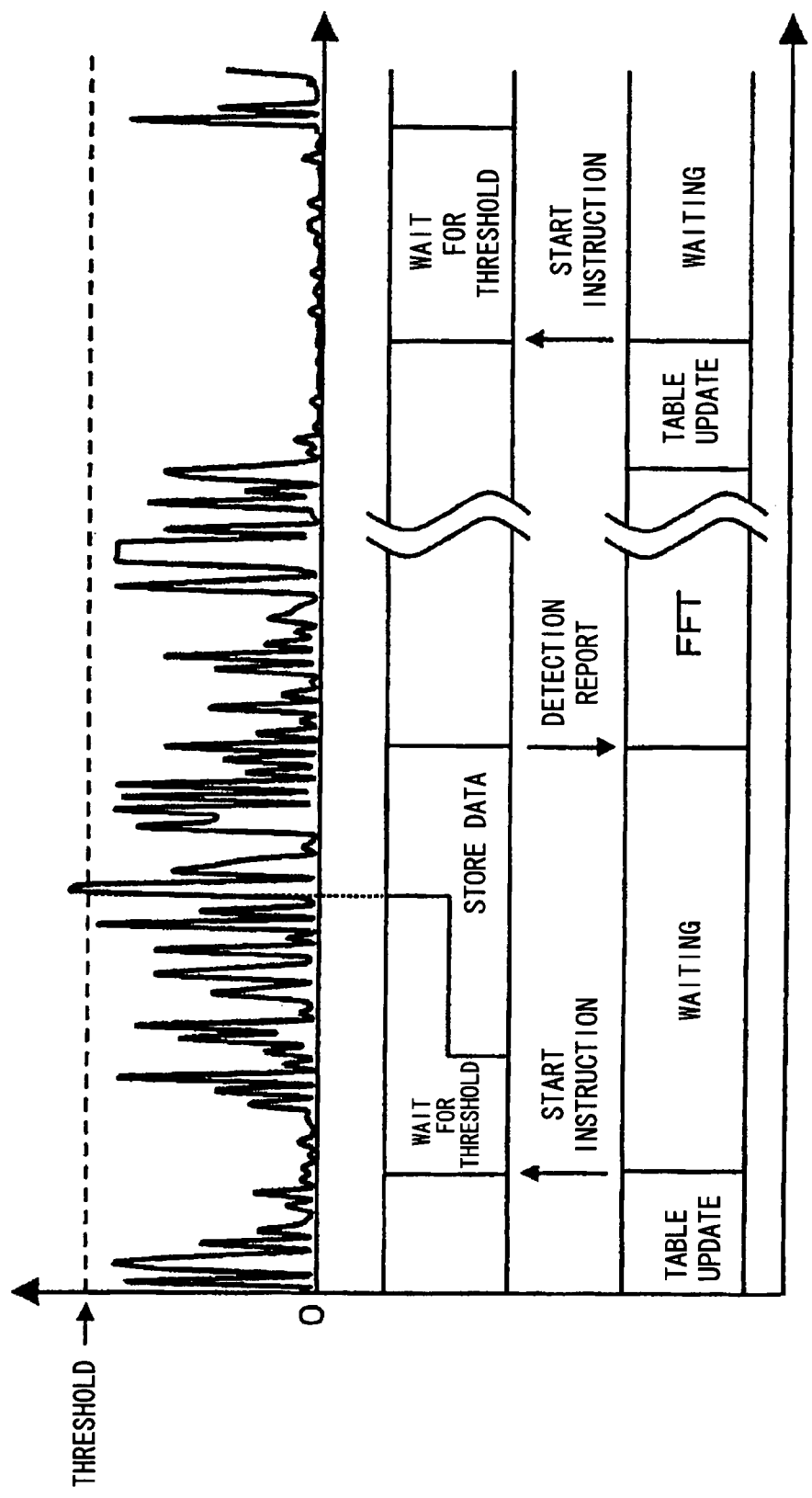
FIG. 8 is a time chart for explaining operations of Embodiment 2.

FIG. 8 is a time chart for explaining operations of the present embodiment. The chart clearly shows that feedback signals preceding a position where the threshold is detected as being exceeded are also stored. The waveform of input levels indicates that signals having at various levels other than a signal exceeding the threshold can be easily included in data that is stored. When distortion compensation values are calculated using a power series, an update of one coefficient can affect the entire range of input levels. Therefore, a distortion evaluation value for judging the properness of the update must reflect distortions over the entire range of input levels. For this reason, a combination of a power series model and FFT is preferably used. A normal perturbation process does not allow a determination on whether the latest update has been proper or not and does not allow the next update to take place unless results of distortion evaluation using FFT are obtained. Therefore, the acquisition of a new feedback signal does not take place during FFT, although FFT takes a long time. That is, the feedback signal acquisition period following an activation instruction, the distortion evaluation period following an end report, and the table updating period are always repeated in a sequential manner.

Figure 9:
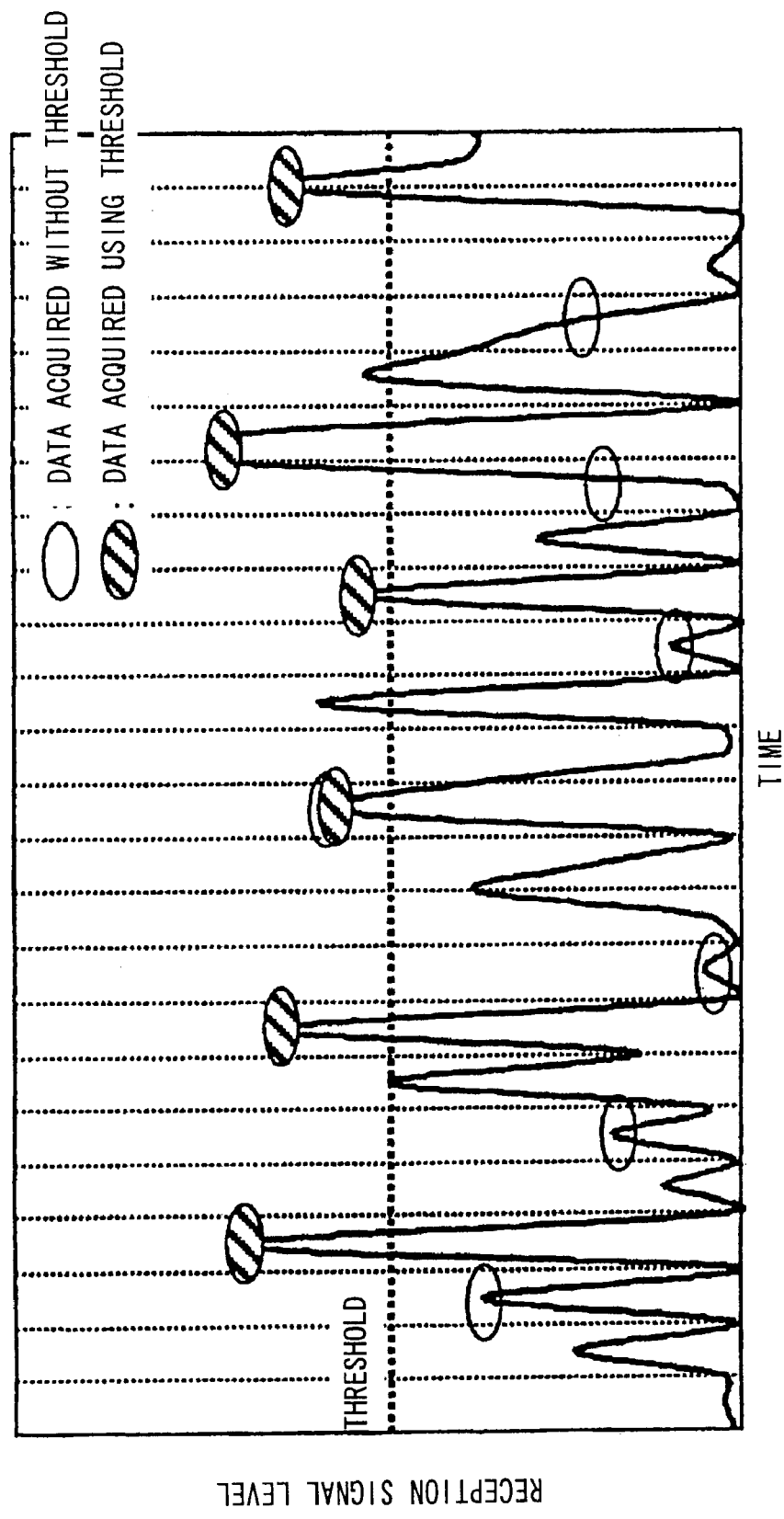
FIG. 9 is a graph showing feedback signal acquiring positions according to the related art and Embodiment 2.

FIG. 9 is a graph showing feedback signal acquiring positions according to the related art and the present embodiment. According to the related art, feedback signals have been acquired at constant time intervals depending on the processing speed of a control unit. On the contrary, feedback signals near peaks in the excess of the threshold are efficiently acquired in the present embodiment.

Figure 10:
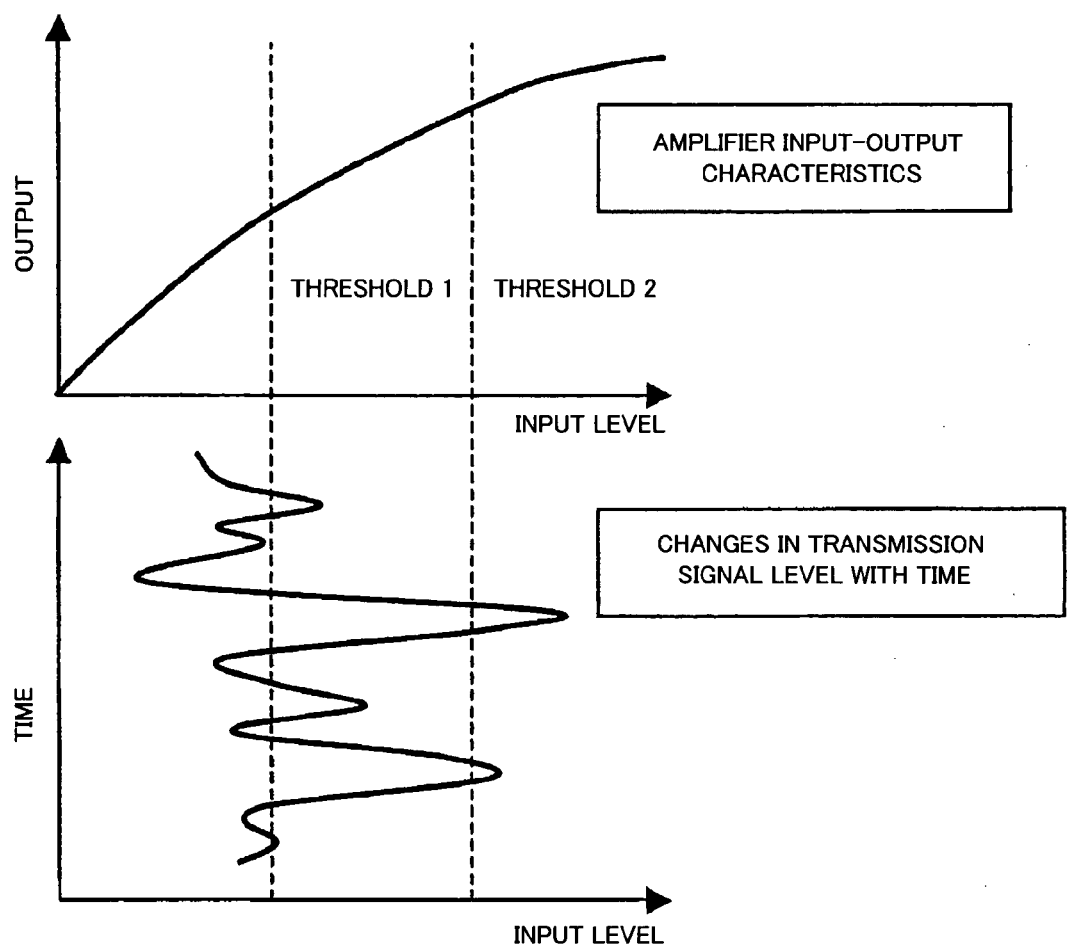
FIG. 10 is a graph for explaining acquisition of feedback signals using a plurality of thresholds in Embodiment 3.

In the present embodiment, preferable data for updating the power series to obtain distortion compensation values can be acquired by setting the threshold at such a high level that non-linear characteristics of the amplifier 4 are demonstrated, which makes it possible to shorten the time of convergence required for the distortion compensation table to reach optimum values. As shown in FIG. 10, a plurality of such thresholds may be provided and sequentially set in the threshold detecting unit 27 during the operation of the amplifier to allow the acquisition of data of a plurality of levels.

EMBODIMENT 3

The present embodiment is different from Embodiment 2 in that a threshold value is varied, and the embodiment shows the exponential functions in a more specific form. The configuration of the present embodiment is equivalent to that of Embodiment 1 or 2 unless otherwise specified.

It is not possible to properly represent compensation values for both of small amplitude and large amplitude with what is called Maclaurin's series which is a popular model of an exponential function and which is expanded about zero amplitude. Under the circumstance, it is described in JP-A-2005-198349 that exponential functions generating even-order distortions such as a series expanded at a point other than a zero point is preferably used.

In the present embodiment, a model of exponential functions expressed by the following expressions is used in order to handle compensation values for low input levels with increased flexibility.

[Expression 1]

$C_A(x)$ represents an amplitude compensation value, and $C_P(x)$ represents a phase compensation value. They are both real functions of amplitude x of an input signal. The value 1 is set slightly higher than a low input level within a dynamic range of 0 to $x_{max}$ of the amplitude x at which reproduction of compensation values have been difficult. Terms $A_3$ to $A_7$ are added to $C_A(x)$ when the amplitude is less than 1. The values of those terms and their differential coefficients which are arbitrary numbers become 0 when x=1 or when the value $C_A(x)$ changes. Therefore, $C_A(x)$ is a smooth function. The absolute term $a_0$ determines the gain of the pre-distorter. Although the term is not directly updated by the perturbation process, it is adjusted to suppress fluctuation of an average gain each time other coefficients are updated. Although the description holds true for $C_A(x)$ except for $p_0$ which is not essential.

When Expression 1 described above is used, it is not necessary to wait for the acquisition of feedback signals at the time when a threshold equal to or greater than the value 1 is exceeded before updating the terms $A_3$ to $A_7$ and $P_3$ to $P_7$. On the contrary, the acquisition of great distortions generated when a threshold is exceeded should be avoided because they act similarly to noises in that they are not required for updating and therefore deteriorate the S–N value. In the present embodiment, therefore, the threshold supplied to the threshold detecting unit is set very low as in Embodiment 1 when the terms $A_3$ to $A_7$ and $P_3$ to $P_7$ are updated and set higher than an average level as in Embodiment 2 when the terms $a_3$ to $a_7$ and $p_3$ to $p_7$ are updated. More generally, when parameters representing a mode of distortion compensation such as coefficients of exponential functions are updated, an optimum threshold is set for each of the parameters.

It is advantageous to vary a threshold in occasions other than the use of a model of exponential functions as described above.

FIG. 10 is a graph for explaining the acquisition of feedback signals using a plurality of thresholds. For example, at an early stage of convergence of compensation values such as the time immediately after the power supply of a distortion compensation amplifying apparatus is turned on, fast convergence can be achieved by acquiring distortions quickly using a threshold set somewhat low to increase the number of updates rather than acquiring distortions accurately spending a longer time using a somewhat high threshold as in Embodiment 2. Therefore, the threshold detecting unit is supplied with a threshold 1 which is set somewhat low at an early stage of convergence, and a threshold 2 which is set normally is supplied thereafter.

EMBODIMENT 4

Figure 11:
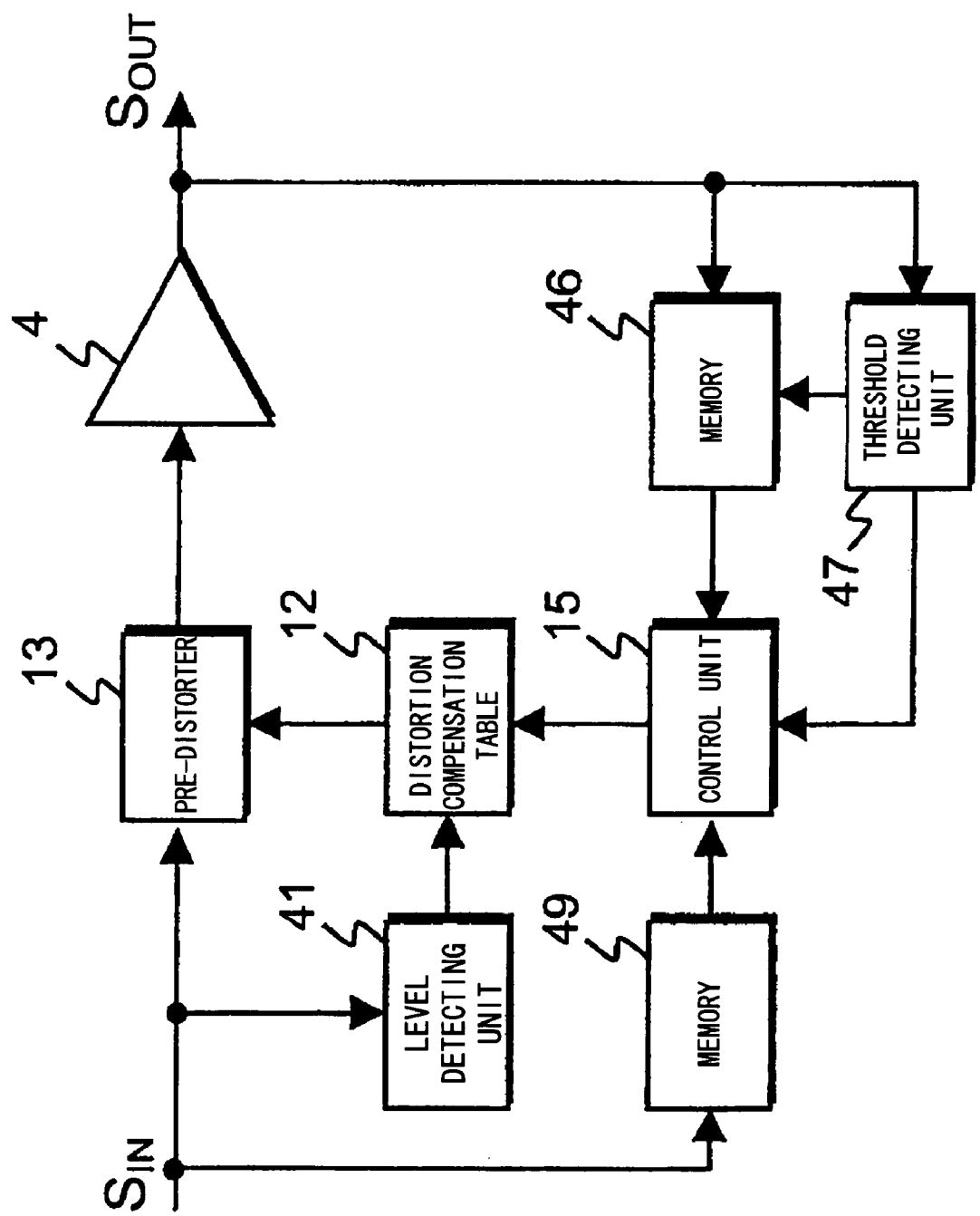
FIG. 11 is a diagram showing a configuration of a distortion compensation amplifying apparatus of Embodiment 4.

FIG. 11 is a block diagram showing a configuration of a distortion compensation amplifying apparatus of the present embodiment. The present embodiment is different from Embodiment 2 in that a threshold detecting unit 47 detects that a feedback signal has exceeded a threshold and in that a control unit 15 evaluates distortion by comparing time waveforms. The configuration of the present embodiment is equivalent to that of Embodiment 2 or Embodiment 1 unless otherwise specified.

An input signal $S_{IN}$ is a digital IF signal as in Embodiment 2.

A level detecting unit 41 may be equivalent to the level detecting unit 11 in Embodiment 1.

A memory 46 is different from the memory 26 of Embodiment 2 in that it receives the input of a feedback signal having the same IF frequency as that of the input signal $S_{IN}$ obtained by performing orthogonal demodulation (orthogonal detection) of the output of an amplifier 4.

A threshold detecting unit 47 is different from that in Embodiment 1 in that it receives the input of a feedback signal and outputs the result of comparison between the level of the feedback signal and a threshold. Since the level of the input signal and the level of the feedback signal are substantially proportionate to each other, and either of the signals may be used without any limitation to the present embodiment.

A memory 49 stores an input signal $S_{IN}$ input thereto and outputs the stored signal $S_{IN}$ in response to a read from a control unit 45.

When a report on the detection of a feedback signal exceeding a threshold is received from the threshold detecting unit 47, the control unit 15 reads the stored input signal $S_{IN}$ and the feedback signal stored in association with the same from the memories 46 and 49, respectively, and calculates any difference between them. Since the signal $S_{IN}$ and the feedback signals are I/Q signals, a difference between their time waveforms is detected as an error vector. Based on LMS algorithm similar to that in Patent Document 1, the distortion compensation values in the distortion compensation table 12 associated with the input signal $S_{IN}$ which is the source of the difference are updated. Before the difference is calculated, the sample rates, delays, phases, gains, and so on of the input signal $S_{IN}$ and the feedback signal must coincide with each other. Therefore, the control unit 15 includes an interpolation or decimation filter to achieve coincidence between the sample rates, address control means for causing the memories 46 and 49 to serve as delay means to achieve coincidence between the delays, and phase rotation compensating means for achieving coincidence between the phases. For example, the address control means controls the reading of the feedback signal using an address offset corresponding to a time difference between a delay that the input signal $S_{IN}$ has when it is input to the memory 49 and a delay that the signal has when it is input to the memory 46 through the amplifier 4.

According to the present embodiment, since distortion is detected as an error vector, the updating direction of distortion compensation values can be determined more easily than when distortion is detected as a scalar amount, and the speed of convergence may be increased.

EMBODIMENT 5

Figure 1:
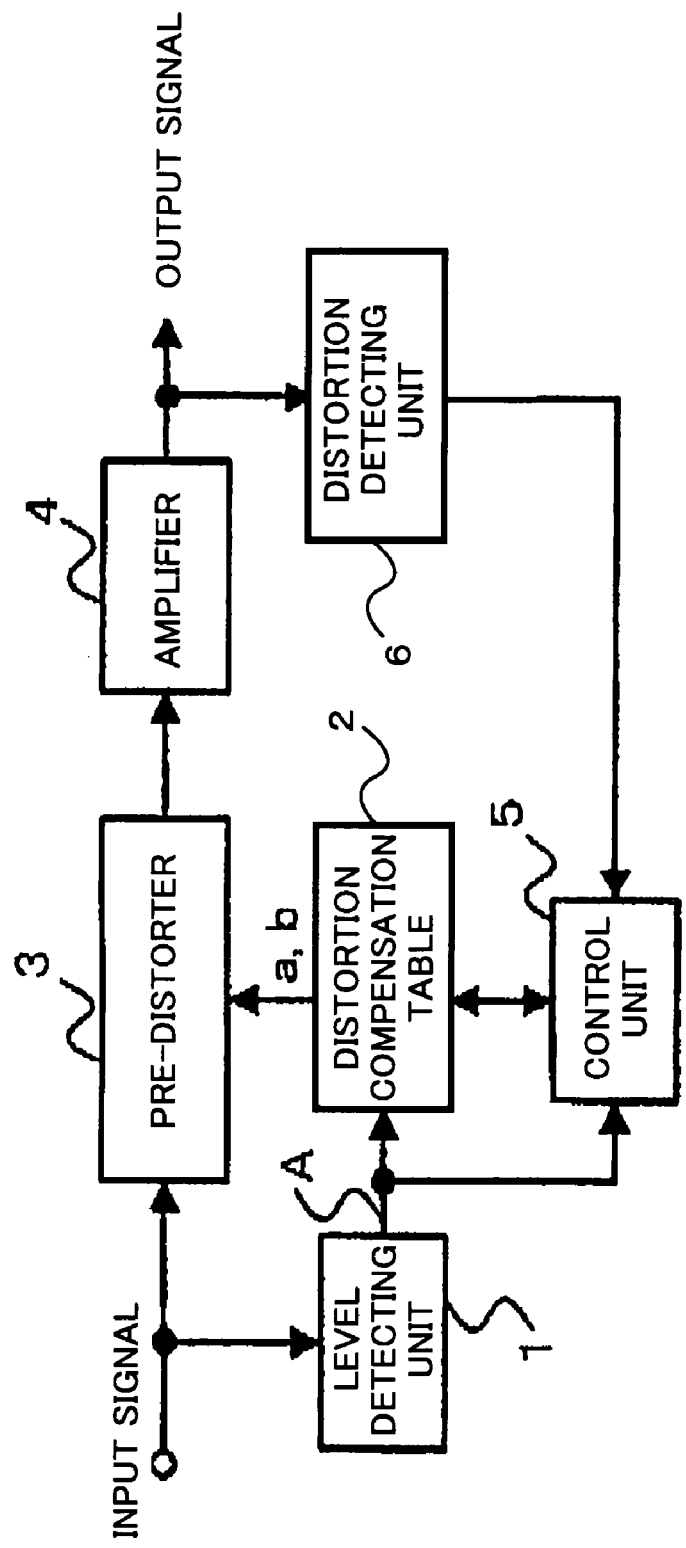
FIG. 1 is a block diagram showing a basic configuration of a distortion compensation amplifying apparatus according to the invention.

FIG. 1 is a block diagram showing a basic configuration of a distortion compensation amplifying apparatus of the present embodiment. The embodiment has substantially the same configuration as the configuration according to the related art shown in FIG. 3 as far as the basic block configuration is concerned. However, it is different in that a distortion detecting unit 6 is apparently shown as detecting distortion residing on an output from an amplifier, in that a control unit 5 is apparently shown as fetching an address signal A to a distortion compensation table 2, and the contents of processes thereof. As described with reference to FIG. 3, a frequency converter and an A-D or D-A converter are provided and configured depending on whether a pre-distorter 3 and a level detecting unit 1 are configured in adaptation to signals in a radio frequency band or signals in an intermediate frequency band. However, the present embodiment is not essentially dependent on such situations, and it can be used in either situation. Therefore, the description will address fundamental constituent elements only.

Referring to FIG. 1, the level detecting unit 1 detects a level (power or amplitude) of an input signal $S_{IN}$ and generates an address signal A associated with the level. It is assumed here that the address signal A is generated such that it has greater address values, the higher the input level. Amplitude compensation values a and phase compensation values b for imparting pre-distortion to the input signal $S_{IN}$ are stored in the distortion compensation table 2 in association with input signal levels. Those compensation values are read from addresses in accordance with an address signal A generated by the level detecting unit 1 and are sent to the pre-distorter 3. Thus, the pre-distorter 3 imparts pre-distortion to the input signal $S_{IN}$ so as to compensate for non-linear characteristics of an amplifier 4. The present embodiment is on an assumption that a pre-distorter constituted by a variable phase device and variable attenuator is used. The distortion detecting unit 6 detects distortion residing on an output from the amplifier 4. It is desirable to detect an average distortion amount which is not dependent on input levels as far as possible, and the object is achieved by transforming (scalarizing) instantaneous distortions into electric power and averaging the same over the required period of time. The control unit 5 performs a process of updating the amplitude compensation values a and the phase compensation values b in the distortion compensation table 2 such that pre-distortion can be imparted in adaptation to changes in the characteristics of the amplifier attributable to aging and temperature.

Figure 2:
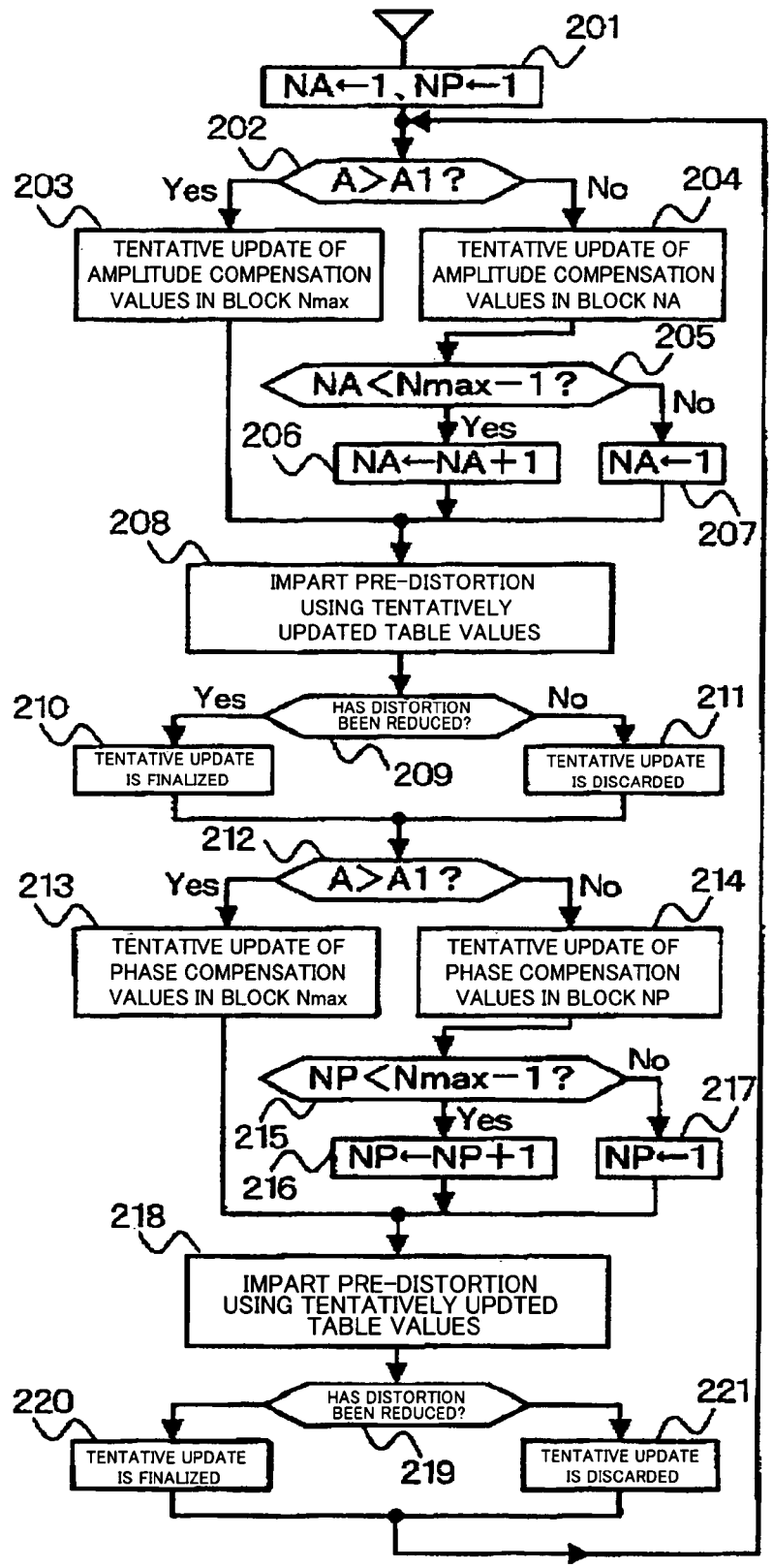
FIG. 2 is a flow chart showing a distortion compensation table updating process in the apparatus in FIG. 1.

FIG. 2 is a flow chart showing an example of a method for a process of updating a distortion compensation table in a distortion compensation amplifying apparatus according to the invention. In this example, an address space of an address signal A is divided into Nmax blocks, i.e., block 1 to block Nmax, as described in Patent Document 2 referred to above. A block number is associated with a higher input signal level, the greater the block number. Each block includes a couple of an amplitude compensation value a and a phase compensation value b representing the block, and interpolation is performed between those values to calculate the amplitude compensation values a and the phase compensation values b associated with all addresses.

Non-linearity of the input-output characteristics of the amplifier significantly appears in the range of input signal levels associated with the block Nmax having the greatest block number. Therefore, distortion components of the amplifier are generated primarily when an input signal level is an input level associated with the block Nmax. Thus, there is a need for an updating process which allows the compensation values of the block Mmax to be always maintained at proper values.

For this purpose, both of control parameters NA and NP are first set at 1 in the process shown in FIG. 2 (step 201). The parameters NA and NP are control variables for sequentially and cyclically updating the amplitude compensation values and the phase compensation values in the blocks 1 to Nmax−1.

Next, a currently generated address signal A is acquired by a level detecting unit and compared with a predetermined threshold A1 (step 202). For example, the threshold A1 is an address associated with the minimum level in the range of input levels associated with the block Nmax. When the value of the address signal A is greater than the threshold A1, the amount of distortion detected when the threshold A1 is exceeded is stored, and the amplitude compensation values a of the block Nmax are tentatively updated (step 203). When the value of the address signal A is smaller than the threshold A1, the amount of distortion at that time is stored, and the amplitude compensation values a of the block NA are tentatively updated (step 204). After step 204, control is exercised to update the amplitude compensation values in the blocks 1 to Nmax−1 sequentially and cyclically by incrementing the parameter NA when NA is a value smaller than Nmax−1 and setting the parameter NA at 1 when it is equal to Nmax−1 (steps 205 to 207).

When the amplitude compensation values in any of the blocks have been tentatively updated, the amplitude compensation values and the phase compensation values in the address A are read from the updated table to impart pre-distortion to the input signal $S_{IN}$ (step 208). Then, it is checked whether the amount of distortion fetched from the distortion detecting unit 6 has decreased from the amount before the update (step 209). If the amount of distortion has decreased, the tentative update made at step 203 or 204 is regarded effective, and the tentatively updated values are used as table values (step 210). If the amount of distortion has not decreased, the tentative update is regarded ineffective, and the table values are returned to the values before the tentative update (step 211).

The above-described process of updating amplitude compensation values is a method called perturbation method, and the tentative update at step 203 or 204 is performed by adding a predetermined small value (perturbation amount) to the amplitude compensation values of the relevant block at that time. Referring to whether to increase or decrease the perturbation amount, the update is made in the same direction as the direction of the previous tentative update of the amplitude compensation values in the relevant block when the update has provided a result in the direction of reducing distortion, and the update is made in the opposite direction when the update has provided a result in the direction of increasing distortion. The same block is updated many times as thus described, which makes it possible to impart pre-distortion such that distortion of the output will be reduced. For this purpose, the result of the determination at step 209 is stored to allow a determination to be made on whether to increase or decrease the amount when the next tentative update of the same block is made.

The processes at steps 212 to 221 in FIG. 2 are processes for updating the phase compensation values b using the perturbation method in the same way as the updating processes for the amplitude compensation values a performed at steps 202 to 211 according to the perturbation method, and description of each of the steps will therefore be omitted.

The distribution of levels of the input signal $S_{IN}$ (or a probability density function indicating the probability of occurrence of each level) has a certain tendency, and the probability of occurrence of a multi-carrier signal or CDMA signal monotonously decreases as the level of the same increases. This is the reverse of the relationship between levels and the amount of distortion in the amplifier 4, and a great distortion generated at a great input level consequently has weaker influence on a detected amount of distortion. Therefore, the distortion detecting unit 6 can obtain one distortion amount reflecting distortion of each level in a stable condition by simply averaging distortions for a certain time during which differences between detected level distributions attributable to fluctuations of the level distribution are negligible. Thus, the same detection method is used for all blocks except the block Nmax. However, variation inevitably occurs each time detection is performed on a level for which an expected value of the number of occurrences in the averaging time is one or less. When the expected value is 0.5 or less, there is substantially no correlation between the properness of an update and an increase or decrease in a detected amount of distortion. An inaccurate distortion amount thus detected does not properly reflect the result of an update and can delay convergence. Therefore, the accuracy of a distortion amount is maintained by detecting the distortion amount on condition that the threshold A1 is exceeded. For example, the threshold A1 in the present embodiment is substantially associated with such levels that the expected value of the number of occurrences is about 1 in a distortion averaging time, although the relationship depends on the dispersion of the input signal $S_{IN}$. Thus, one or more peaks associated with the block Nmax (one peak may be represented by a plurality of samples at a high sampling frequency) are always included in the averaging time. In practice, even a small positive correlation existing between a real distortion amount and a detected distortion amount allows compensation value updating algorithm to result in convergence in most cases, although the convergence is slow. Therefore, the threshold A1 is decided in a manner that is not so strict. It is essentially important to set the distortion averaging time and the threshold such that distortions based on distortion compensation amounts belonging to a block to be updated will have an expected number of occurrences of 0.5 or more. Converging speed and accuracy of convergence can be maximized by optimizing the balance between the improvement of detection accuracy achieved by expanding the distortion averaging time and parameters (the perturbation amount, step size, and so on) determining the stability of the compensation value updating algorithm.

After the tentative update of the amplitude compensation values is made at step 203 or 204, a somewhat long time may be spent before the amplitude compensation values a and phase compensation values b read from the distortion compensation table 2 updated based on the result of the tentative update are supplied to the pre-distorter 3. In particular, the compensation values in the block Nmax are read at a low frequency. However, great signals which may be associated with the block Nmax are successively generated in a relatively short time in most cases, and such a tendency may be advantageously utilized in that a distortion amount can be detected in a shorter time compared to that in the related art after a tentative update that is triggered when the threshold A1 is exceeded. However, a time-out may be asserted when there is no readout within a predetermined time, and the process may return to step 202 with the tentative update aborted and without inverting the sign of the perturbation amount. On the contrary, since the block NA is read at a high frequency, the amount of residual distortion which has been pre-distorted based on tentatively updated compensation values and fetched by the distortion detecting unit 6 becomes available as soon as the tentative update is finished. Therefore, accuracy may be improved by fetching and averaging a multiplicity of distortion amounts.

In the process in FIG. 2 described above, the process of updating the amplitude compensation values or phase compensation values of the block having a maximum range of amplitude is performed without fail when the level of an input signal is equal to or higher than a predetermined value. Therefore, compensation values associated with great input amplitude which is a major cause of non-linear distortion can be updated at an improved frequency to allow distortion compensation based on more accurate pre-distortion even when the frequency of occurrence of peak values is low as in the case of a CDMA type or OFDM type signal. When there is input amplitude equal to or less than a predetermined value, the compensation values in the blocks other than that associated with the maximum amplitude range are sequentially and cyclically updated. As a result, update processes associated with those blocks can be performed a greater number of times than in the related art. When the process is categorized using the predetermine value as thus described, it is not necessary to detect distortion amounts with stability for all levels. Thus, the distortion amount averaging time can be shortened, and it is possible to detect a distortion amount which strongly reflects distortion in the block for which an update to be detected has been performed.

In the example shown in FIG. 2, a range having significant non-linear characteristics attributable to saturation of the amplifier constitutes a single block Nmax. Even when the range of input levels is divided to provide a plurality of such blocks, the plurality of blocks can be easily updated with priority. Although the perturbation method is employed as the updating method, other methods may alternatively be used.

INDUSTRIAL APPLICABILITY

The invention is preferably applied to linear amplification in which an increase in power consumption attributable to the provision of features for distortion compensation can be overwhelmed by the advantage of a reduction in power consumption achieved by the capability of putting the operating point of the amplifier closer to the compression point. The invention has a wide range of applications where a high degree of linearity must be achieved in converting various signals utilizing solid-state physics, the applications including modulation of not only electrical waves but also optical and acoustic waves.

DESCRIPTION OF REFERENCE NUMERALS AND SIGNS 1, 11: level detecting unit
2, 12: distortion compensation table
3, 13: pre-distorter
4: amplifier
5, 15: control unit
6: distortion detecting unit]
16: memory
17: threshold detecting unit 28: feedback circuit unit
49: memory

The invention claimed is:

1. A distortion compensation amplifying apparatus comprising:
    a pre-distorter for imparting pre-distortion to an input signal;
    an amplification unit for amplifying the pre-distorted input signal;
    a threshold detecting unit for detecting that a level of said input signal has exceeded threshold;
    a memory for storing a feedback signal from said amplification unit based on the timing at which said threshold detecting unit detects that said input signal level has exceeded said threshold; and
    a control unit for updating a distortion compensation mode of said pre-distorter based on said feedback signal stored in said memory.

2. A distortion compensation amplifying apparatus according to claim 1, wherein the threshold detecting unit receives the input of said feedback signal and detects that a level of said input signal has exceeded the threshold based on said feedback signal.

3. A distortion compensation amplifying apparatus according to claim 1, wherein said memory does not store the feedback signal from said application unit unless said threshold detecting unit detects that said input signal level has exceeded said threshold.

4. A distortion compensation amplifying apparatus according to claim 3, wherein said threshold is set greater than a level in the absence of said input signal and smaller than a normal level at the time of said input signal.

5. A distortion compensation amplifying apparatus according to claim 1, wherein said control unit models said pre-distortion using an exponential function of the amplitude of said input signal, evaluates a time-averaged value of out-of-band leakage power included in said feedback signal as a distortion amount, and updates a coefficient of said exponential function such that said distortion amount decreases.

6. A distortion compensation amplifying apparatus according to claim 5, wherein said threshold is set at a peak level which is higher than a normal standard level.

7. A distortion compensation amplifying apparatus according to claim 1, wherein said control unit sets different thresholds in said threshold detecting unit according to the state of updating of said distortion compensation mode.

8. A distortion compensation amplifying apparatus according to claim 1, wherein said control unit represents a mode of distortion compensation using a plurality of parameters and sets a threshold associated with each parameter in said threshold detecting unit when the parameter is updated.

9. A distortion compensation amplifying apparatus comprising:
    level detecting means for detecting levels of an input signal;
    a distortion compensation table for outputting pre-distortion control signals associated with the input levels detected by said level detecting means;
    a pre-distorter for imparting distortion according to the pre-distortion control signals output from said distortion compensation table to said input signal;
    an amplifier for amplifying the input signal distorted by said pre-distorter;
    distortion detecting means for detecting a time-average of distortion output from said amplifier as a distortion amount; and
    table updating means for updating said pre-distortion control signal such that said distortion amount becomes smaller, wherein:
    said table updating means divides said pre-distortion control signals into a first group associated with input levels of said input signal greater than a predetermined threshold and a second group constituted by at least part of the remaining pre-distortion control signals, fetches said input levels, updates a pre-distortion control signal in said first group when an input level thus fetched is greater than said threshold, and updates a pre-distortion control signal in said second group when said fetched input signal level is smaller than said threshold.

10. A distortion compensation amplifying apparatus according to claim 9, wherein said threshold is set such that an expected value of the number of occurrences of the levels belonging to said first group is 0.5 or more in a period in which distortions are time-averaged when it is determined that said input levels are greater than said threshold.

* * * * *